United States Patent
Choudhary et al.

(10) Patent No.: US 11,569,397 B2
(45) Date of Patent: Jan. 31, 2023

(54) HYBRID TRANSPARENT CONDUCTING ELECTRODE

(71) Applicants: Tata Steel Limited, Mumbai (IN); Centre for Nano and Soft Matter Sciences, Bangalore (IN)

(72) Inventors: Shyam Kumar Choudhary, Mumbai (IN); Sumitesh Das, Mumbai (IN); Giridhar Udapi Rao Kulkarni, Bangalore (IN); Rajashekhar Ningappa Pujar, Bangalore (IN)

(73) Assignees: Tata Steel Limited; Centre for Nano and Soft Matter Sciences

( * ) Notice: Subject to any disclaimer, the term of this patent is extended or adjusted under 35 U.S.C. 154(b) by 0 days.

(21) Appl. No.: 16/769,991

(22) PCT Filed: Dec. 6, 2018

(86) PCT No.: PCT/IB2018/059698
§ 371 (c)(1),
(2) Date: Jun. 4, 2020

(87) PCT Pub. No.: WO2019/111191
PCT Pub. Date: Jun. 13, 2019

(65) Prior Publication Data
US 2021/0202762 A1    Jul. 1, 2021

(30) Foreign Application Priority Data
Dec. 6, 2017    (IN) .............................. 201721043702

(51) Int. Cl.
*H01L 31/0224*    (2006.01)
*H01L 31/18*    (2006.01)
*H01L 51/44*    (2006.01)

(52) U.S. Cl.
CPC .. *H01L 31/022466* (2013.01); *H01L 31/1884* (2013.01); *H01L 51/442* (2013.01)

(58) Field of Classification Search
CPC ......... H01L 31/022466; H01L 31/1884; H01L 51/442; H01L 33/42
(Continued)

(56) References Cited

U.S. PATENT DOCUMENTS 4,544,706 A    10/1985  Finch et al.
9,871,217 B1 *   1/2018  Lin .................... H01L 51/5234
(Continued)

OTHER PUBLICATIONS

Singhbabu et al., "Observation of large positive magneto-resistance in bubble decorated graphene oxide films derived from shellac biopolymer: a new carbon source and facile method for morphology-controlled", Nanoscale, 2015, 7, 6510, pp. 6510-6591 (Year: 2015).*
(Continued)

*Primary Examiner* — Duy T Nguyen
(74) *Attorney, Agent, or Firm* — Fish & Richardson P.C.

(57) ABSTRACT

The present invention relates to hybrid transparent conducting electrode comprising reduced graphene oxide film, metal mesh and textured glass, wherein the reduced graphene oxide film is coated on the textured glass embedded with the metal mesh or the reduced graphene oxide film is sandwiched between the textured glass and the metal mesh. The present invention also relates to a process of preparing the hybrid conducting transparent conducting electrode. The said transparent conducting electrode exhibits transparency ranging from about 70% to 85% with sheet resistance ranging from about 5 Ω/sq to 100 Ω/sq.

7 Claims, 6 Drawing Sheets

(58) Field of Classification Search
USPC .......................................................... 257/40
See application file for complete search history.

(56) References Cited

U.S. PATENT DOCUMENTS

| | | |
|---|---|---|
| 2012/0306361 A1 | 12/2012 | Werners et al. |
| 2013/0133925 A1 | 5/2013 | Kim et al. |
| 2014/0313562 A1* | 10/2014 | Ruoff .................... G02F 1/1506 |
| | | 359/265 |
| 2018/0220559 A1 | 8/2018 | Lerner et al. |
| 2018/0304322 A1 | 10/2018 | Bellman et al. |

OTHER PUBLICATIONS

Ahn et al., "Improved Thermal Oxidation Stability of Solution-Processable Silver Nanowire Transparent Electrode by Reduced Graphene Oxide," ACS Applied Materials & Interfaces, Dec. 2012, 4(12):6410-6414.

PCT International Preliminary Report on Patentability in International Appln. No. PCT/IB2018/059698, dated Jan. 7, 2020, 9 pages.

PCT International Search Report in International Appln. No. PCT/IB2018/059698, dated Mar. 6, 2019, 3 pages.

PCT Response to International Search Report and Written Opinion along with Demand (under Article 34) filed in corresponding International Application No. PCT/IB2018/059698, filed Oct. 7, 2019, 7 pages.

PCT Written Opinion in International Appln. No. PCT/IB2018/059698, dated Mar. 6, 2019, 5 pages.

Qiu et al., "Hydrogen reduced graphene oxide/metal grid hybrid film: towards high performance transparent conductive electrode for flexible electrochromic devices," Carbon, Jan. 2015, 81:232-238.

\* cited by examiner

HYBRID TRANSPARENT CONDUCTING ELECTRODE

CROSS-REFERENCE TO RELATED APPLICATIONS

The present application is the national stage entry of International Patent Application No. PCT/IB2018/059698, filed on Dec. 6, 2018, and claims priority to Application No. IN 201721043702, filed in the Intellectual Property India on Dec. 6, 2017, the disclosure of which are express incorporated herein in entirety by reference thereto.

TECHNICAL FIELD

The present invention is in relation to electrodes. The present invention particularly relates to hybrid transparent conducting electrode. The hybrid transparent conducting electrode comprises reduced graphene oxide film, metal mesh and textured glass. The present invention further relates to a process of preparing the said hybrid transparent conducting electrode.

BACKGROUND OF THE INVENTION

Transparent conducting electrode is the cynosure of the optical devices industry. The astute need of the transparent conducting electrodes is expressively acknowledged across the optical device industry involving solar panels, smartphone, computer, televisions, windshields and the like, owing to the consistent effort to develop better devices.

Indium tin oxide (ITO) is the highly preferred material to obtain transparent conducting electrodes, however this has challenges due to cost and brittle nature of ITO. Many alternatives are being developed with metal wire meshes, graphene reduced graphene coatings and carbon nano tubes. Each technology poses challenge to be addressed for optimum benefit. The direct growth of graphene on non-catalytic substrates like quartz and glass involves the conventional CVD process for graphene growth at higher temperature about 900° C. to 1050° C. and need longer time duration for graphene growth from about 2 hour to 6 hours. The said process also uses combustible gases like methane, methanol as precursor. Further, CVD system requires catalytic nano particles such as Nickel and Copper as seed layer for graphene growth and uses argon as carrier gas and $H_2$ for promoting graphene growth.

Various substrates are being explored to coat and obtain conducting transparent materials and amongst them glass occupies premium position with its unique properties.

However, the adoption of metal wire mesh, graphene, reduced graphene and the like on textured glass is a challenge as the available technologies fail to get the desired product at the level of texturing of glass embedded with metal wire mesh, and reduced graphene oxide or vice versa.

SUMMARY OF THE INVENTION

Accordingly, the present invention describes a hybrid transparent conducting electrode comprising reduced graphene oxide film, metal mesh and textured glass.

The present invention also relates to a process of preparing the hybrid transparent conducting electrode, comprising—texturing the glass or the glass embedded with metal mesh; and coating the textured glass embedded with the metal mesh with the reduced graphene oxide film or coating the textured glass with the reduced graphene oxide film followed by coating the metal mesh, to obtain the hybrid transparent conducting electrode.

BRIEF DESCRIPTION OF THE ACCOMPANYING FIGURES

In order that the present invention may be readily understood and put into practical effect, reference will now be made to exemplary embodiments as illustrated with reference to the accompanying figures. The figures together with detailed description below, are incorporated in and form part of the specification, and serve to further illustrate the embodiments and explain various principles and advantages, in accordance with the present invention where:

FIG. 3a: illustrates the transparency of the hybrid transparent conducting electrode in the photograph.

FIG. 3b illustrates the corrosion rates of the glass embedded with copper mesh (Cu-Mesh) and the hybrid transparent electrode of the present invention (rGO/Cu-Mesh).

Figure 4:
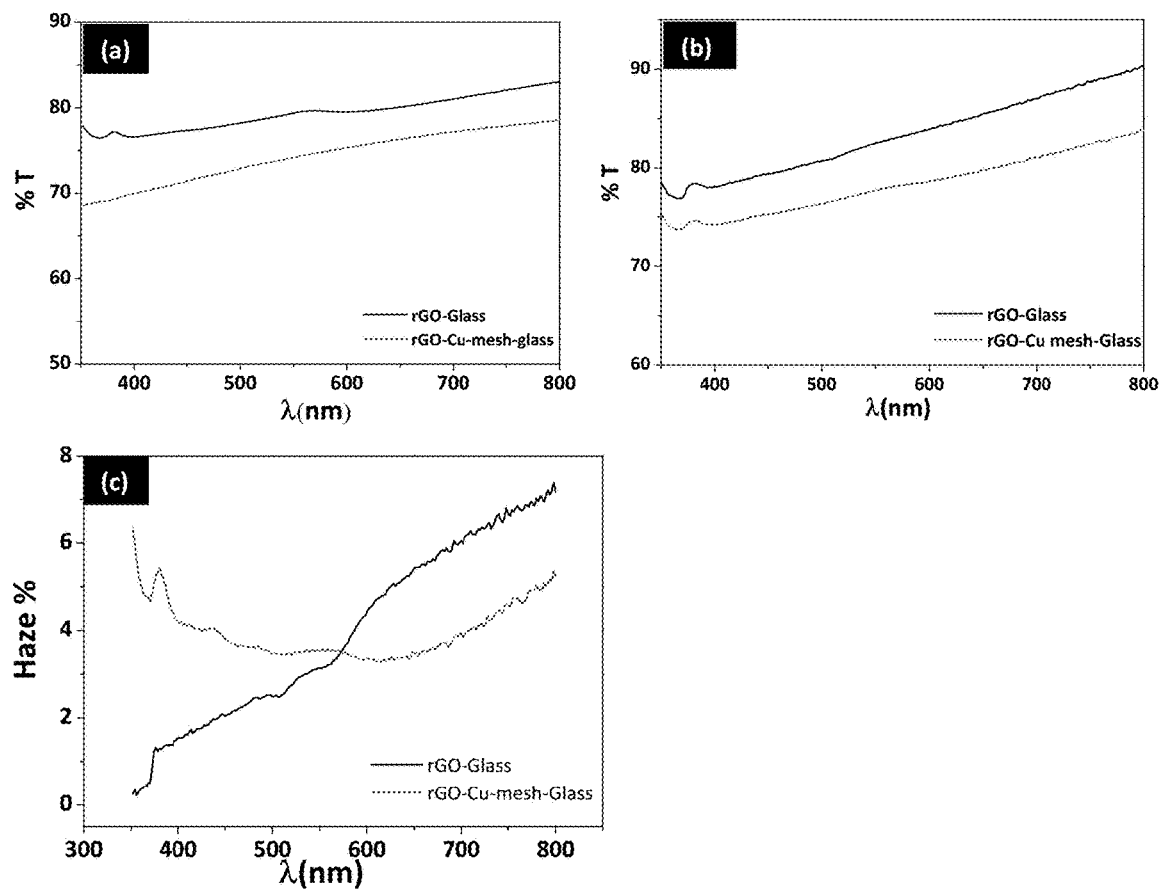

FIGS. 4a and 4b illustrates transmittance plot in specular and diffused mode of reduced graphene oxide coated glass (rGO/glass) and the hybrid transparent electrode of the present invention (rGO/Cu-mesh/glass), respectively.

FIG. 4c illustrates the Haze plot of reduced graphene oxide coated glass (rGO/glass) and the hybrid transparent electrode of the present invention (rGO/Cu-mesh/glass).

Figure 5:
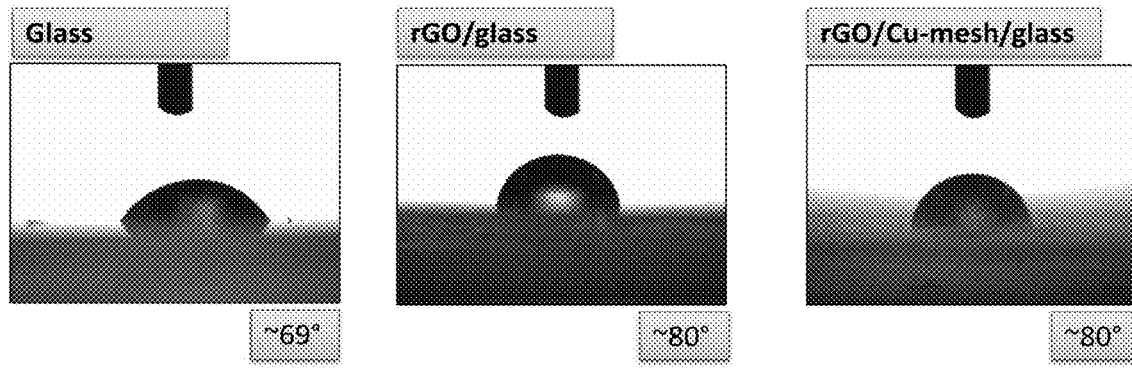

FIG. 5 illustrates the digital images of contact angle of glass, reduced graphene oxide coated glass (rGO/glass) and the hybrid transparent electrode of the present invention (rGO/Cu-mesh/glass).

FIG. 6a illustrates the resistance of reduced graphene oxide coated glass (rGO/glass)

FIG. 6b illustrates the resistance of the hybrid transparent electrode of the present invention (rGO/Cu-mesh/glass).

FIG. 6c illustrates relative change in the resistance of reduced graphene oxide coated glass (rGO/glass) and the hybrid transparent electrode (rGO/Cu-mesh/glass) of the present invention FIG. 7a illustrates a plot describing change in resistance with number of scotch tape peeling of reduced graphene oxide coated glass (rGO/glass)

FIG. 7b illustrates a plot describing pencil hardness level of the hybrid transparent electrode (rGO/Cu-mesh/glass) of the present invention.

Figure 8:
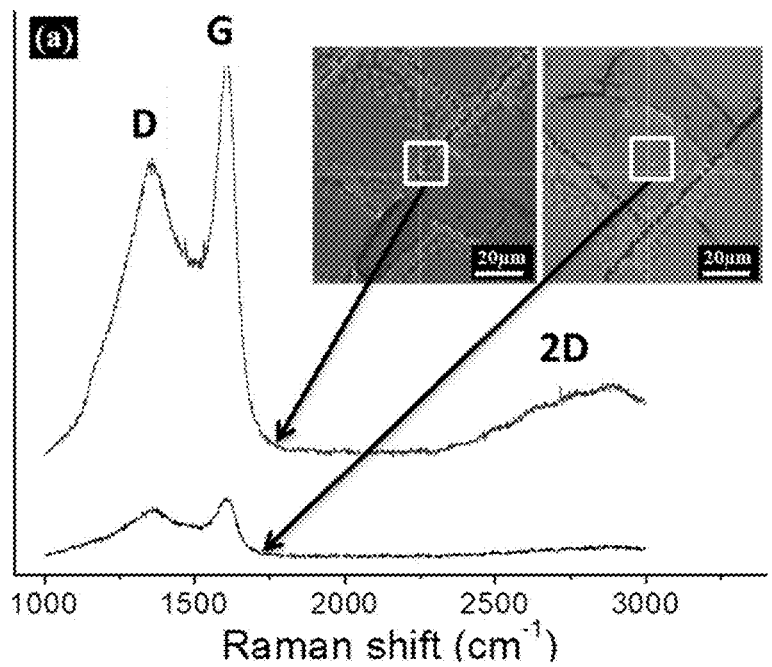

FIG. 8 illustrates Raman spectra recorded on metal mesh and in void regions of the hybrid transparent electrode of the present invention (rGO/Cu-mesh/glass).

FIG. 9a illustrates the IR image of the graphene coated glass slide.

FIG. 9b illustrates the heating cycles of graphene coated glass slide.

Figure 10:
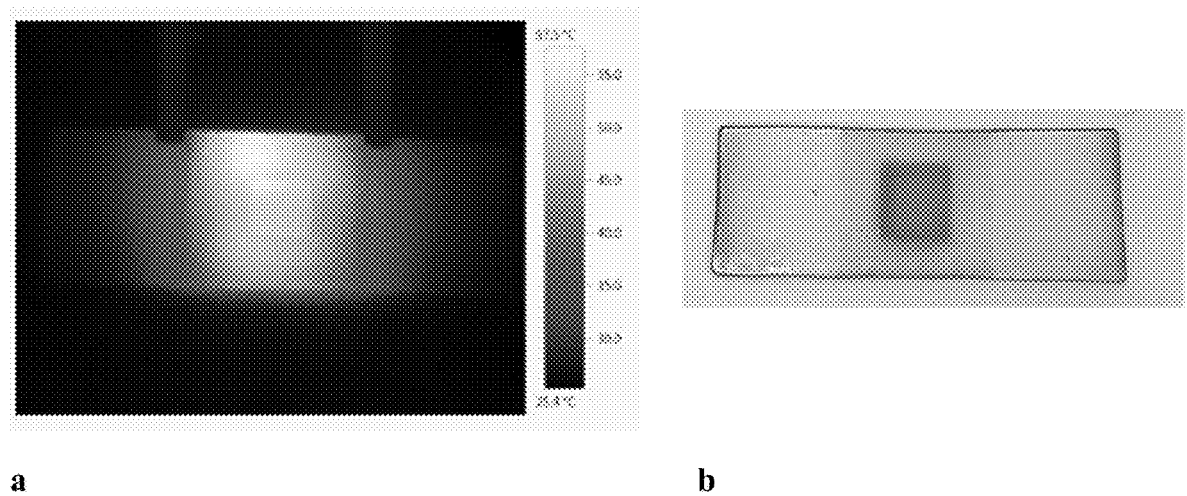

FIG. 10a illustrates the IR image of hybrid transparent conducting electrode.

FIG. 10b illustrates the digital image of hybrid transparent conducting electrode.

Figure 11:
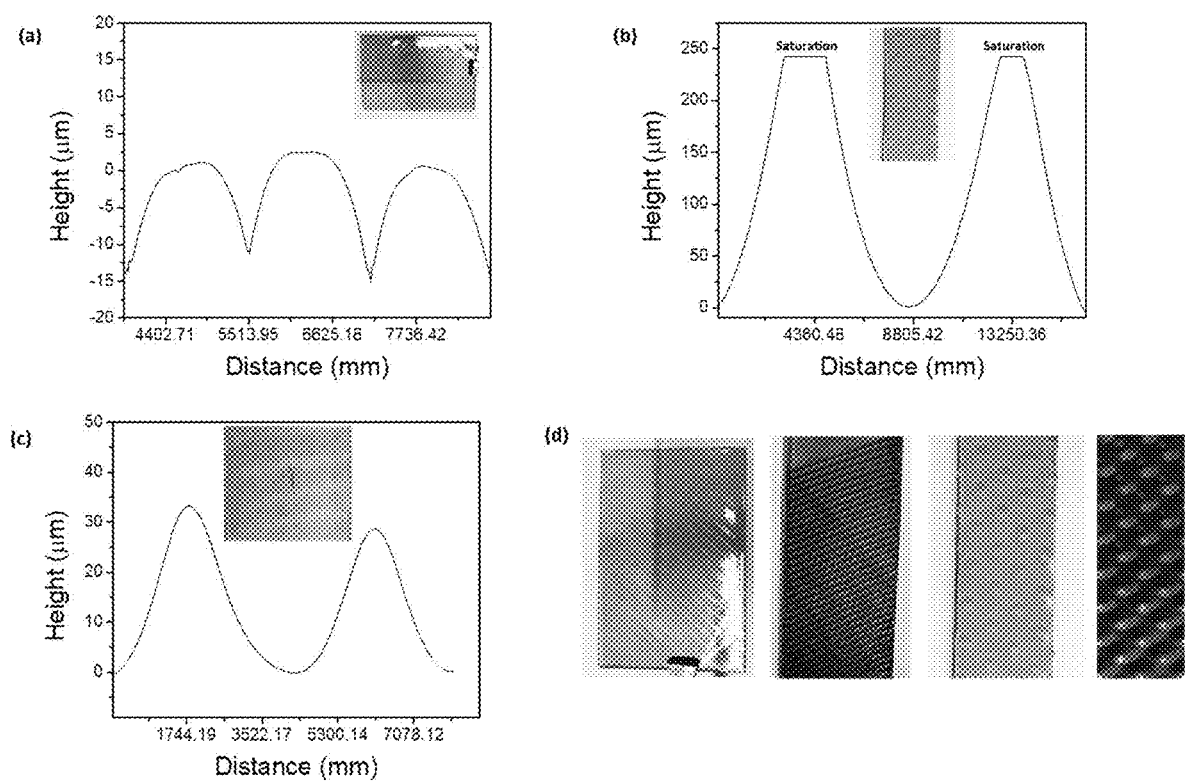

FIG. 11a-11c illustrates the height profile of texture on glass substrate obtained after graphene oxide growth.

FIG. 11d illustrates digital images of textured glass and their respective stainless steel substrates.

DETAILED DESCRIPTION OF THE INVENTION

The foregoing description of the embodiments of the invention has been presented for the purpose of illustration.

It should not be construed that the scope of the invention is limited to the disclosure herein.

The various embodiments of the hybrid transparent conducting electrode of the present invention along with its process of preparation/fabrication are described below with reference to the figures.

It may further be noted that as used herein and in the appended claims, the singular forms "a", "an", and "the" include plural reference unless the context clearly dictates otherwise. Unless defined otherwise, all technical and scientific terms used herein have the same meanings as commonly understood by person skilled in the art.

The present invention relates to hybrid transparent conducting electrode.

In an embodiment, the present invention relates to hybrid transparent conducting electrode comprising reduced graphene oxide film, metal mesh and textured glass.

In an embodiment, the hybrid transparent conducting electrode comprises reduced graphene oxide film, metal mesh and textured glass, wherein the reduced graphene film is coated on the textured glass embedded with the metal mesh.

In another embodiment, the hybrid transparent conducting electrode comprises reduced graphene oxide film, metal mesh and textured glass, wherein the reduced graphene oxide film is sandwiched between the textured glass and metal mesh.

In an embodiment, carbon source of the reduced graphene oxide film is shellac.

In an embodiment, the reduced graphene oxide film in the hybrid transparent conducting electrode is a monolayer.

In another embodiment, the reduced graphene oxide film in the hybrid transparent conducting electrode comprises plurality of layers.

In an embodiment, the metal mesh comprises metal selected from a group comprising copper, silver, aluminum, gold, tin and nickel.

In another embodiment, the metal mesh comprises alloy selected from a group comprising aluminium-zinc alloy, aluminium-silica alloy, copper-nickel alloy, bronze, nickel-chromium alloy, steel and mild steel.

In an embodiment, the hybrid transparent conducting electrode has transparency ranging from about 70% to 85%.

In another embodiment, the hybrid transparent conducting electrode has transparency of about 70%, about 72%, about 74%, about 76%, about 78%, about 80%, about 82%, about 84% or about 85%.

In an embodiment, the hybrid transparent conducting electrode has sheet resistance ranging from about 5 Ω/sq to 100 Ω/sq.

In another embodiment, the hybrid transparent conducting electrode has sheet resistance of about 5 Ω/sq, about 10 Ω/sq, about 15 Ω/sq, about 20 Ω/sq, about 25 Ω/sq, about 30 Ω/sq, about 35 Ω/sq, about 40 Ω/sq, about 45 Ω/sq, about 50 Ω/sq, about 55 Ω/sq, about 60 Ω/sq, about 65 Ω/sq, about 70 Ω/sq, about 75 Ω/sq, about 80 Ω/sq, about 85 Ω/sq, about 90 Ω/sq, about 9511/sq or about 100 Ω/sq.

In an embodiment, the hybrid transparent conducting electrode demonstrates reduced resistance. The reduced resistance of the hybrid transparent conducting electrode is due to the combined effect of metal mesh and the reduced graphene oxide film on the textured glass substrate.

In an embodiment, the hybrid transparent conducting electrode has corrosion rate is ranging from about 0.09 mm/year to 1.0 mm/year.

In another embodiment, the hybrid transparent conducting electrode has corrosion rate of about 0.09 mm/year, about 0.1 mm/year, about 0.2 mm/year, about 0.3 mm/year, about 0.4 mm/year, about 0.5 mm/year, about 0.6 mm/year, about 0.7 mm/year, about 0.8 mm/year, about 0.9 mm/year/or about 1.0 mm/year.

In an embodiment, the conductivity of the hybrid transparent conducting electrode is due to the coating of reduced graphene oxide film on the textured glass embedded with the metal mesh.

In another embodiment, the conductivity of the hybrid transparent conducting electrode is due to the reduced graphene oxide film sandwiched between the textured glass and the metal mesh.

In another embodiment, the conductivity of the hybrid transparent conducting electrode is due to metal mesh and reduced graphene oxide embedded on the textured glass.

In an embodiment, the hybrid transparent conducting electrode is stable and can withstand extreme conditions such as high humidity and high temperatures.

The said hybrid transparent electrode was stable at relative humidity ranging from about 0% to 85% and temperature ranging from about 25° C. to 85° C.

The said hybrid transparent electrode was stable at relative humidity of about 85% and at a temperature of about 85° C. for about 18 hours.

The present invention further relates to process of preparing the hybrid transparent conducting electrode.

In an embodiment, the process of preparing the hybrid transparent conducting electrode comprises—
  texturing the glass or the glass embedded with metal mesh; and
  coating the textured glass embedded with the metal mesh with the reduced graphene oxide film or coating the textured glass with the reduced graphene oxide film followed by coating the metal mesh,
to obtain the hybrid transparent conducting electrode.

In an embodiment, the process of preparing the hybrid transparent conducting electrode comprises—
  texturing the glass embedded with metal mesh; and
  coating the textured glass embedded with metal mesh with reduced graphene oxide film to obtain the hybrid transparent conducting electrode.

In an embodiment, the glass embedded with metal mesh is obtained by coating colloidal solution over the glass by technique including but not limited to drop casting and spin coating, followed by air drying the glass at temperature ranging from about 25° C. to 40° C. for about 60 seconds, which results in formation of crackle template on the glass.

The crackle template on the glass is deposited with the metal selected from a group comprising copper, silver, aluminium, gold, tin and nickel or the alloy selected from a group comprising aluminium-zinc alloy, aluminium-silica alloy, copper-nickel alloy, bronze, nickel-chromium alloy, steel and mild steel, by vacuum deposition methods to obtain metal wire mesh on glass or glass embedded with metal mesh.

In an embodiment, the vacuum deposition method is physical vapor deposition, chemical vapor deposition, low pressure chemical vapor deposition, plasma enhanced chemical vapor deposition, or any combinations thereof.

In an embodiment, glass having the crackle template is subjected to physical vapor deposition, wherein about 50 mg to 1000 mg of the metal or the alloy is embedded on the glass. The physical vapor deposition chamber is closed to attain pressure of about $10^{-5}$ mbar to $10^{-6}$ in about 80 minutes to 90 minutes and the chamber temperature is maintained at about 25° C. to 30° C. The metal is evaporated once the chamber crosses $10^{-5}$ mbar pressure. Once, the metal or the alloy is deposited on the glass, lift-off is performed by dipping the glass in chloroform solution for a period of about 1 minute to 2 minutes to remove the colloidal material.

In another embodiment, about 50 mg, about 100 mg, about 150 mg, about 200 mg, about 250 mg, about 300 mg, about 350 mg, about 400 mg, about 450 mg, about 500 mg, about 550 mg, about 600 mg, about 650 mg, about 700 mg, about 750 mg, about 800 mg, about 850 mg, about 900 mg or about 1000 mg of the metal or the alloy is embedded on the glass.

In an embodiment, texturing the glass embedded with the metal mesh and coating the reduced graphene oxide film on the textured glass embedded with the metal mesh is carried out simultaneously.

In an embodiment, texturing the glass embedded with the metal mesh and coating the reduced graphene oxide comprises heating the glass embedded with metal mesh placed on a textured stainless steel and at least one feeder comprising shellac. The heating is carried out at a temperature ranging from about 400° C. to 1200° C. under vacuum at a pressure ranging from about $10^{-1}$ to $10^{-3}$ mbar for a period of about 1 minute to 15 minutes. The said heating causes the shellac to vaporize and contact the textured glass embedded with the metal mesh, thereby forming coat of the reduced graphene oxide film on the textured glass embedded with metal mesh upon cooling to a temperature ranging from about 25° C. to 50° C.

In another embodiment, the heating is carried out at a temperature of about 400° C., about 500° C., about 600° C., about 700° C., about 800° C., about 900° C., about 1000° C., about 1100° C. or about 1200° C. under vacuum at a pressure of about $10^{-1}$ mbar, about $10^{-3}$ mbar or about $10^{-3}$ mbar, for a period of about 1 minute, about 2 minutes, about 3 minutes, about 4 minutes, about 5 minutes, about 6 minutes, about 7 minutes, about 8 minutes, about 9 minutes, about 10 minutes, about 11 minutes, about 12 minutes, about 13 minutes, about 14 minutes or about 15 minutes.

In an embodiment, reduced graphene oxide coat is formed on the texture glass upon cooling to a temperature of about 25° C., about 30° C., about 35° C., about 40° C., about 45° C. or about 50° C.

In an embodiment, the feeder comprises shellac at a concentration ranging from about 10 gram/liter to 200 gram/liter. The shellac is casted on the feeder by technique including but not limited to spin coating, dipping, spraying, bar coating, slot coating and drop casting.

In another embodiment, the feeder comprises shellac at a concentration of about 10 gram/liter, about 20 gram/liter, about 40 gram/liter, about 60 gram/liter, about 80 gram/liter, about 100 gram/liter, about 120 gram/liter, about 140 gram/liter, about 150 gram/liter, about 160 gram/liter, about 180 gram/liter or about 200 gram/liter.

In an embodiment, the process of preparing the hybrid transparent conducting electrode comprises—
    texturing the glass and coating the textured glass with reduced graphene oxide film; and
    coating the metal mesh on the reduced graphene oxide film of the textured glass to obtain the hybrid transparent conducting electrode.

In another embodiment, the process of preparing the hybrid transparent conducting electrode comprises—
    texturing the glass and coating the glass with reduced graphene oxide film;
    coating colloidal solution on top of textured reduced graphene oxide film;
    drying the glass to obtain crackle template; and
    coating metal on the crackle template, followed by washing the template to obtain the hybrid transparent conducting electrode.

In an embodiment, texturing the glass and coating the reduced graphene oxide comprises heating the glass placed on a textured stainless steel and at least one feeder comprising shellac. The heating is carried out at a temperature ranging from about 400° C. to 1200° C. under vacuum at a pressure ranging from about $10^{-1}$ mbar to $10^{-3}$ mbar for a period ranging from about 1 minute to 15 minutes. The said heating causes the shellac to vaporize and contact the textured glass, thereby forming coat of the reduced graphene oxide on the textured glass upon cooling to a temperature ranging from about 25° C. to 50° C.

In another embodiment, the heating is carried out at a temperature of about 400° C., about 500° C., about 600° C., about 700° C., about 800° C., about 900° C., about 1000° C., about 1100° C. or about 1200° C. under vacuum at a pressure of about $10^{-1}$ mbar, about $10^{-3}$ mbar or about $10^{-3}$ mbar, for a period of about 1 minute, about 2 minutes, about 3 minutes, about 4 minutes, about 5 minutes, about 6 minutes, about 7 minutes, about 8 minutes, about 9 minutes, about 10 minutes, about 11 minutes, about 12 minutes, about 13 minutes, about 14 minutes or about 15 minutes.

In an embodiment, reduced graphene oxide coat is formed on the texture glass upon cooling to a temperature of about 25° C., about 30° C., about 35° C., about 40° C., about 45° C. or about 50° C.

In an embodiment, the feeder comprises shellac at a concentration ranging from about 10 gram/liter to 200 gram/liter. The shellac is casted on the feeder by technique including but not limited to spin coating, dipping, spraying, bar coating, slot coating and drop casting.

In another embodiment, the feeder comprises shellac at a concentration of about 10 gram/liter, about 20 gram/liter, about 40 gram/liter, about 60 gram/liter, about 80 gram/liter, about 100 gram/liter, about 120 gram/liter, about 140 gram/liter, about 150 gram/liter, about 160 gram/liter, about 180 gram/liter or about 200 gram/liter.

In an embodiment, coating the metal mesh on the reduced graphene oxide film coated textured glass comprises depositing the metal selected from a group comprising copper, silver, aluminium, gold, tin and nickel or the alloy selected from a group comprising aluminium-zinc alloy, aluminium-silica alloy, copper-nickel alloy, bronze, nickel-chromium alloy, steel and mild steel, by vacuum deposition methods.

In an embodiment, in the above described processes of coating reduced graphene oxide film on the textured glass embedded with metal mesh or on the textured glass, the reduced graphene oxide coating is controlled in a specific region by introducing a physical mask which contains hollow region which allows the coating of the reduced graphene oxide in that region.

In an embodiment, the above described processes of preparing hybrid transparent conducting electrode is simple and cost effective.

In the process of the present invention ecofriendly precursor is employed to grow reduced graphene oxide at lower temperatures ranging 750° C. to 850° C. with vacuum ranging of $10^{-3}$ mbar to $10^{-2}$ mbar and at lower time period ranging from about 1 minutes to 15 minutes. Importantly no metal catalyst is employed in the process of preparing the hybrid transparent conducting electrode.

Conventionally, most glasses soften under the graphene synthesis condition (at 650° C.), In order to control the glass flow and deformation of glass in the process of the present invention, metal plate is introduced with desired texture below the glass which uses the glass softening property and control the glass flow which gives raise to textured glass, such that glass deformation is controlled and contained to the texturing available on the metal plate. This way the glass is elegant but can be made to host graphene.

Figure 1:
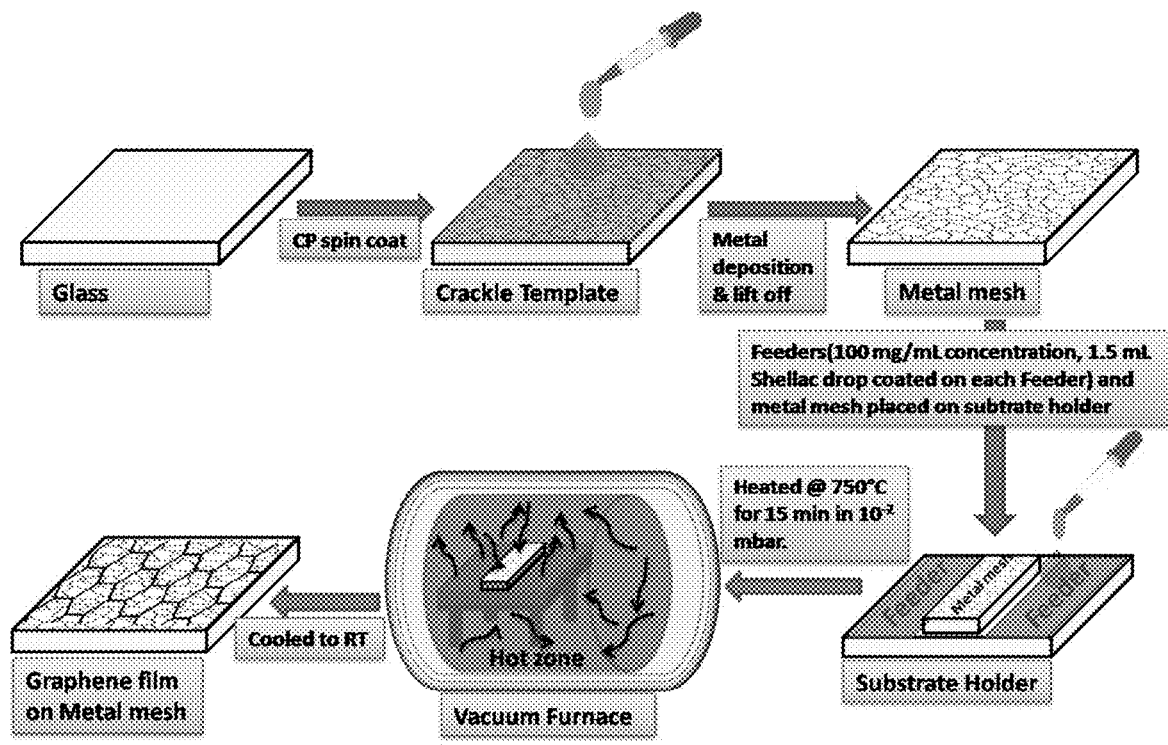
FIG. 1 illustrates experimental step up for production of the hybrid transparent conducting electrode.

In an embodiment, the FIG. 1 illustrates the process of preparing the hybrid transparent conducting electrode schematically, wherein the glass is embedded with metal wire mesh, placed in a substrate holder on top of a textured stainless-steel plate, coating the feeder with the source of carbon (shellac) and heated in a furnace/chamber under vacuum to obtain hybrid transparent conducting electrode.

Figure 2:
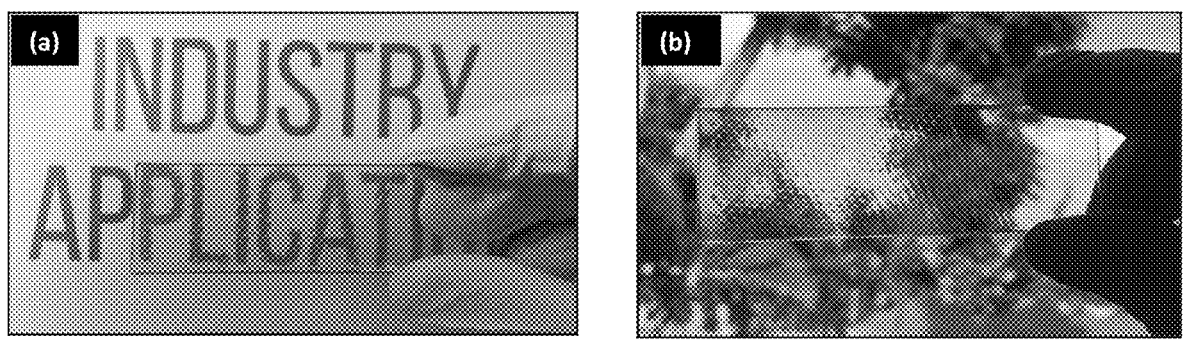
FIG. 2 illustrates the transparency of the ordinary glass slide coated with graphene.

In an embodiment, the FIG. 2 depicts the photographs of graphene coated glass slide, illustrating the transparency and resistance. The graphene coated glass show resistance of about 200 k$\Omega$.

Figure 3:
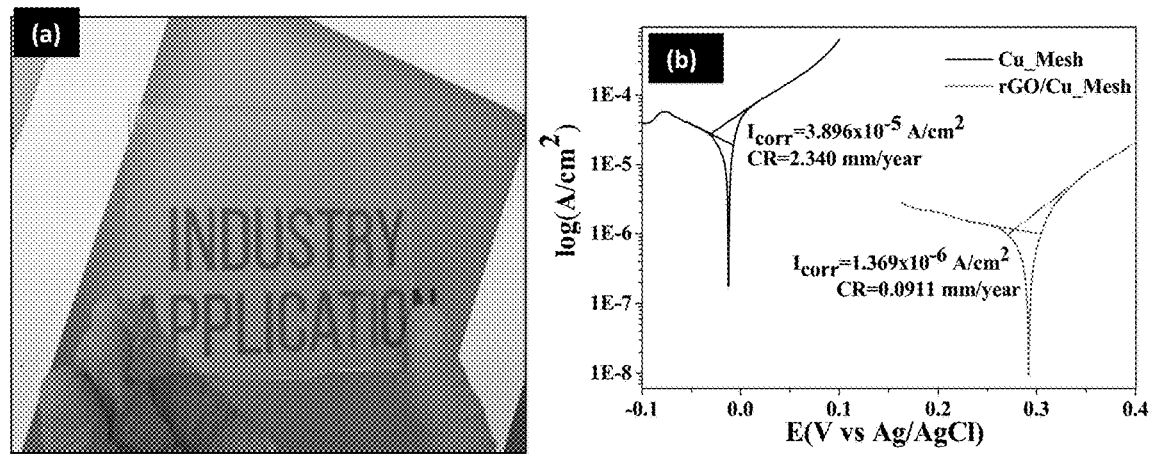

In an embodiment, the FIG. 3 depicts the photographs of the hybrid transparent conducting electrode, illustrating the transparency and resistance. The hybrid transparent conducting electrode shows resistance of about 30$\Omega$ with high transparency when compared to the glass slide depicted in FIG. 2.

Also, the reduced graphene oxide coating in the hybrid transparent conducting electrode makes the metal mesh (Cu mesh) corrosion tolerant and it is about 13 times better than the metal mesh (Cu-mesh) alone.

In an embodiment, the FIGS. 4a and 4b illustrates the transmittance plot in specular and diffused mode, respectively, demonstrating that the hybrid transparent conducting electrode is found to be conducting all over the region of the reduced graphene oxide film with sheet resistance of about 5 $\Omega$/sq to 100 $\Omega$/sq. And, having the optical transmission/transmittance of about 70% to 85% in the visible region.

The FIG. 4c depicts the haze plot, wherein the haze calculation is carried out to check the influence of texturing in the hybrid transparent conducting electrode. It is observed that the haze is about 5% which is minimal even after texturing the glass.

In an embodiment, the FIG. 5 illustrates the digital images of contact angle measured on glass, reduced graphene oxide coated glass (rGO/glass) and the hybrid transparent electrode of the present invention (rGO/Cu-mesh/glass). The contact angle measurement is carried out to show the hydrophobicity. It is noted that the coating of reduced graphene oxide film on the textured glass embedded with metal mesh makes the electrode more hydrophobic when compared to bare glass.

In an embodiment, the FIG. 8 illustrates Raman spectra confirming the presence of reduced graphene oxide film on the metal mesh in the hybrid transparent conducting electrode. In an embodiment, the FIGS. 11a to 11c illustrates the height profile of glass textures. Texturing of the glass is carried out by using stainless steel substrate illustrated in FIG. 11d. As per the height profile described in FIG. 11a, the minimum feature size obtained is 25 µm. As per the disclosure of the present invention, the feature size that can be textured varies in the range of about 25 µm to 1000 µm.

Additional embodiments and features of the present invention will be apparent to one of ordinary skill in art based upon the description provided. The embodiments provide various features and advantageous details thereof in the description. Description of well-known/conventional methods and techniques are omitted so as to not unnecessarily obscure the embodiments. The examples provided herein are intended merely to facilitate an understanding of ways in which the embodiments provided may be practiced and to further enable those of skill in the art to practice the embodiments provided. Accordingly, the following examples should not be construed as limiting the scope of the embodiments.

EXAMPLES

Example 1: Preparation of the Hybrid Transparent Conducting Electrode

A. Preparation of Glass Embedded with Metal Wire Mesh/Metal Mesh.

Colloidal solution is made by adding about 0.4 g of resinous particle in solvent (water or diluter) of volume of about 1 ml at a temperature ranging from about 25° C. to 40° C. and sonicating the solution for about 10 minutes. About 0.25 ml of the colloidal solution is coated over the glass surface of about 2"×2" by drop casting or spin coating, followed by air drying the glass at temperature of about 25° C. to 40° C. for about 60 seconds which results in crack formation on the glass (crackle template).

The crackle template is placed inside Physical vapor deposition (PVD) chamber and about 400 mg of copper is deposited. The chamber is closed to attain pressure of about $10^{-5}$ to $10^{-6}$ mbar in about 80 minutes to 90 minutes and the chamber temperature is maintained at about 25° C. to 30° C. The metal on the glass is evaporated once the chamber crosses the pressure of about $10^{-5}$ mbar and there is deposition of the metal on the crackle template. After, the metal deposition is complete, the crackle template is taken out and lift-off is performed by dipping the crackle template in chloroform solution for about 1 minute to 2 minutes to remove the colloidal material. After lift-off the glass is left with metal wire mesh on the surface.

The above described preparation can be employed for depositing other metal selected from a group comprising silver, aluminium, gold, tin, nickel or the alloy selected from a group comprising aluminium-zinc alloy, aluminium-silica alloy, copper-nickel alloy, bronze, nickel-chromium alloy, steel and mild steel, to obtain glass having the metal mesh on the surface of the glass or glass embedded with metal mesh.

B. Preparation of Carbon Source for Coating Reduced Graphene Oxide Film

A solution of the about 100 mg/L shellac precursor is made by adding about 10 g of shellac in isopropanol solvent of volume of about 100 ml at a temperature ranging from about 25° C. to 90° C. by gentle mixing using magnetic stirrer for about 15 minutes. Said solution is kept as it is in stationary state for about 2 hours to 3 hours for settling down the contamination. About 1.5 ml of the shellac solution is coated over the quartz (feeder) surface of about 2"×2" by drop casting.

C. Preparation of the Hybrid Transparent Conducting Electrode

The stainless-steel plate with desired texture (illustrated in FIG. 11d) is placed below the glass embedded with metal mesh and is placed in a chamber alongside the feeder as described in FIG. 1.

FIGS. 11a to 11c illustrates the height profile of glass textures. The chamber is heated using an electro-heating furnace to a temperature of about 750° C. for about 15 minutes under vacuum at pressure of about 10' mbar. During heating the vapours of the shellac is deposited on the metal mesh of the glass, which forms a coat of reduced graphene oxide film on the metal mesh embedded on the glass while cooling to temperature of about 25° C. to 40° C. As a result, the hybrid transparent conducting electrode is obtained.

Example 2

A. Corrosion resistance property of hybrid transparent conducting electrode was tested by electrochemical investigations using CH instruments in three electrode configurations.

In the 3-electrode configuration, copper mesh (Cu-mesh) or the hybrid transparent conducting electrode (rGO/Cu-mesh/glass) are employed as working electrodes, Platinum counter electrode and standard Ag/Ag/Cl as reference electrode.

The area of the working electrode is about 0.98 cm² and about 1.28 cm² for Cu-mesh and rGO/Cu-mesh/glass, respectively in about 0.1M NaCl electrolyte at a temperature of about 25° C. to 40° C. The cathodic and anodic polarization measurements are performed at a scan rate of 5 mV/s. The corrosion potential (Ecorr) and corrosion current (Icon) are derived through extrapolation from Tafel polarization curve. The corrosion rate is calculated using the equation given below—

$$CR=(I_{corr} \times K \times EW)/(p \times A)$$

Where, K, corrosion rate constant=3272 mm/year; EW, equivalent weight=31.7 g for Cu; p, material density=8.94 g/cm3 for Cu and the sample area A in cm² and Icon is current density in A/cm².

The corrosion resistance of rGO to underlying Cu-mesh is studied using electrochemical measurements (see FIG. 3b). Using Tafel analysis, the Tafel polarization curve for rGO/Cu-mesh/glass shows a positive shift of about 181 mV of corrosion potential and a lower corrosion current of about 15 mV compared to bare cu-mesh. The corrosion current (Icon) values are found to be $3.896 \times 10^{-6}$ Acm$^{-2}$ and $1.369 \times 10^{-5}$ Acm$^{-2}$ for rGO/Cu-mesh/glass and Cu-mesh, respectively. Accordingly, the corrosion rates are estimated to be 0.0911 mm/year and 2.340 mm/year, respectively. It is significant that the corrosion rate is about 13 times lower for rGO/Cu-mesh compared to that of bare Cu-mesh.

The corrosion test of the hybrid transparent conducting electrode are carried out against highly acidic and basic chemicals, wherein the hybrid transparent conducting electrode was directly dipped in highly concentrated acidic and basic chemicals.

The hybrid transparent conducting electrode shows very good resistance to degradation in terms of electrical properties. The results are shown in table 1.

TABLE 1

Resistance change of hybrid transparent conducting electrode with respect to different acid and base treatments.

| Chemical | Aqueous concentraion | Resistance Before (~kΩ) | Resistance After 1 hour (~kΩ) |
|---|---|---|---|
| H₂SO₄ | 95-98% | 50 | 53 |
| HNO₃ | 67% | 28 | 30 |
| HCl | 37% | 44 | 48 |
| H₂O₂ | 30% | 52 | 54 |
| NaOH | 1M | 40 | 41 |
| KOH | 1M | 42 | 43 |

B. Environment chamber test was conducted to test the stability of the hybrid transparent conducting electrode.

Figure 6:
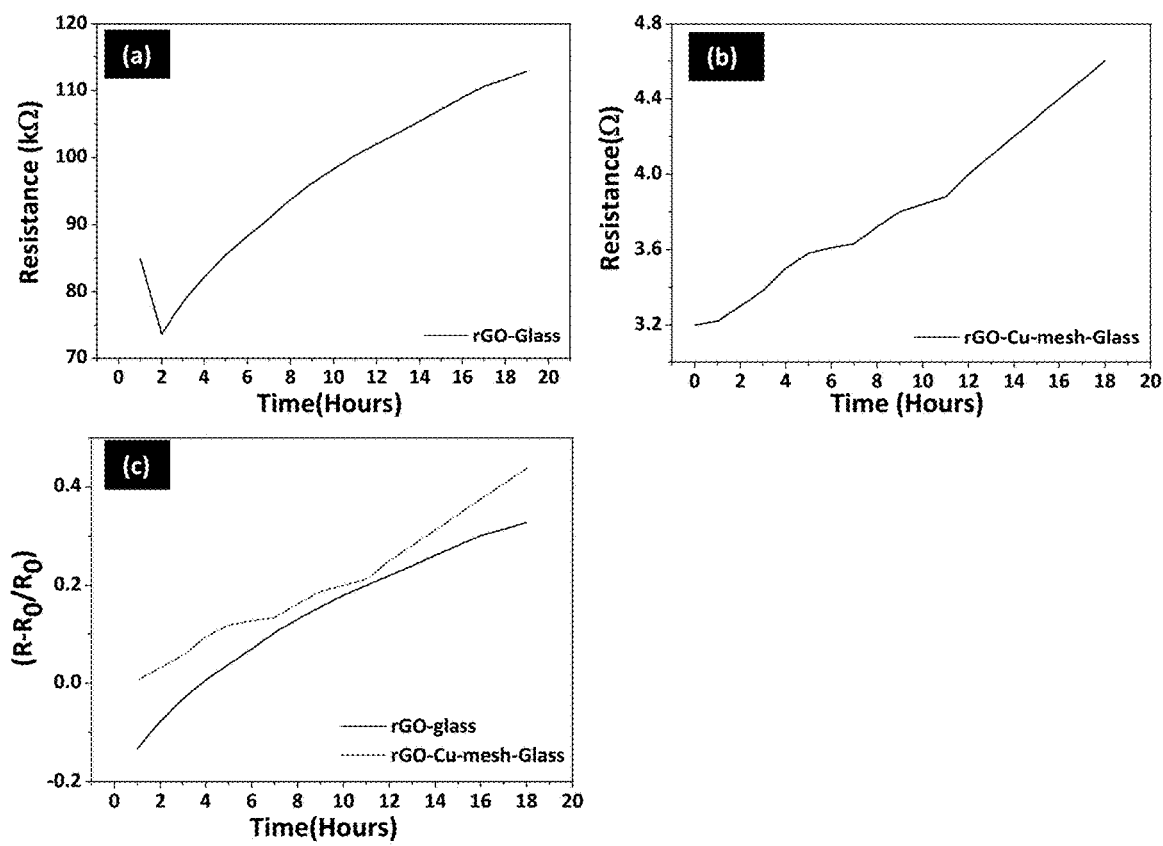

The Environmental chamber test was conducted at about 85% relative humidity and at temperature of about 85° C. FIG. 6a shows change in resistance of rGO/glass and rGO/cu-mesh/glass. FIG. 6b shows change in the substrate (glass) with time, and FIG. 6 (c) is the plot of relative change in resistance of both the samples with respect to time.

The said Environmental chamber test demonstrates that the reduced graphene oxide film coating in the hybrid transparent conducting electrode is stable and can withstand extreme humid and high temperatures.

C. Pencil hardness test was performed to check the adhesion of the reduced graphene oxide film coating over the glass embedded metal mesh of the hybrid transparent conducting electrode (rGO/Cu-mesh/glass) and on rGO/Cu-mesh substrate.

The said test was performed to check the adhesion level of the material to the substrate where one among the different level pencil is selected and it is slid on to the other substrate to measure the change in resistance.

The hybrid transparent conducting electrode of the present invention preformed well to 6H hardness level and showed minimal variation in resistance even after 100 cycles of 6H scratch test when compared to the rGO/Cu-mesh substrate.

Figure 7:
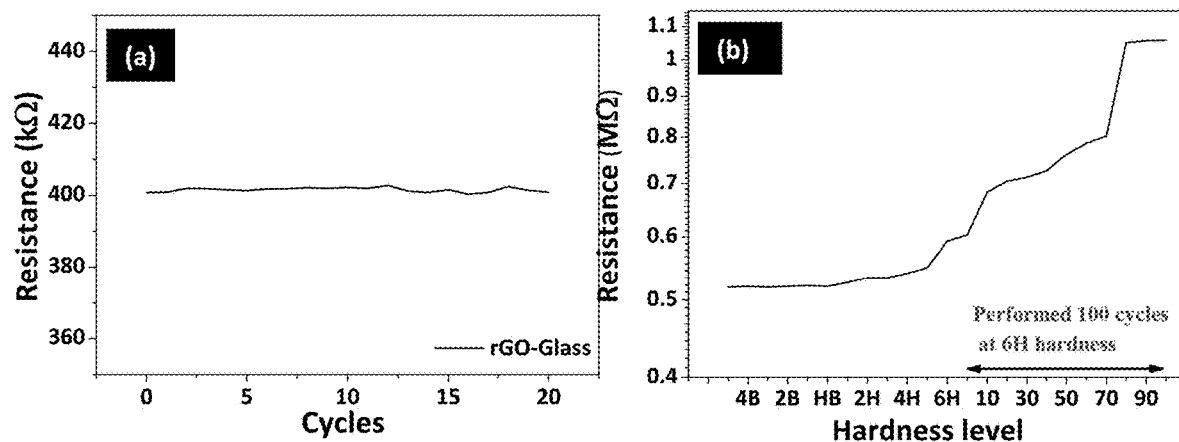

The FIG. 7 shows the plot of change in resistance with number of scotch tape peeling (FIG. 7a) and with different pencil hardness level (FIG. 7b).

D. The area and shape of reduced graphene coating in the hybrid transparent conducting electrode is determined by the physical mask brought on top and its resolution (about few microns to 15 cm).

The hybrid transparent conducting electrode is noted have reduced graphene coat of about 10 mm×10 mm area successfully with a sheet resistance of about 10 Ω/sq and the hybrid transparent conducting electrode can be joule heated to a temperature of about 60° C. by applying about 3V.

Figure 9:
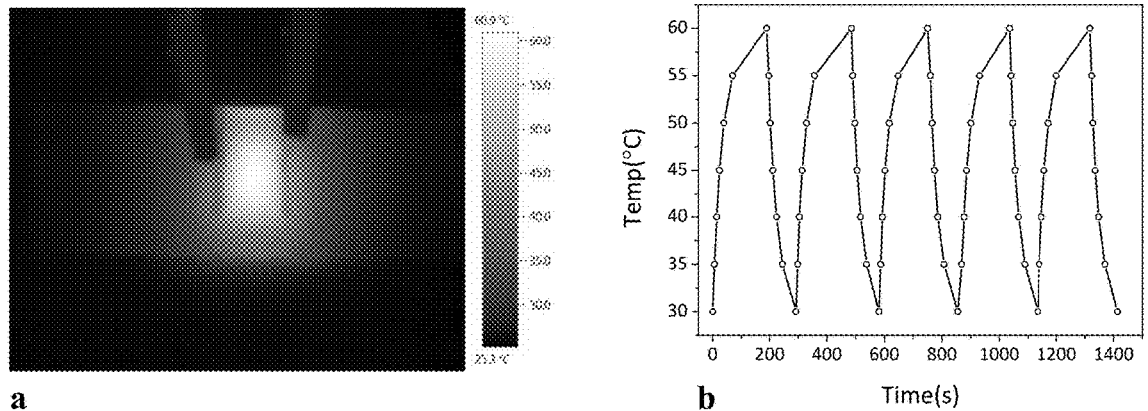

The FIG. 9 illustrates that heating rates can be controlled by input power, heating zone can be made uniform and the heating cycles are reproducible while coating reduced graphene oxide film on the glass slide.

The IR image and digital image of the hybrid transparent conducting electrode is shown in FIG. 10a and FIG. 10b, respectively.

We claim:

1. A Hybrid transparent conducting electrode comprising:
   i. reduced graphene oxide film formed from vapors of shellac;
   ii. metal mesh; and
   iii. textured glass,
   wherein the reduced graphene oxide film is coated on the textured glass embedded with the metal mesh,
   wherein the metal content on the glass in the electrode is ranging from about 50 mg to 1000 mg; and wherein the electrode has haze of about 5%.

2. The hybrid transparent conducting electrode as claimed in claim 1, wherein the reduced graphene oxide can sustain 6H hardness level.

3. The hybrid transparent conducting electrode as claimed in claim 1, has transparency ranging from about 70% to 85%.

4. The hybrid transparent conducting electrode as claimed in claim 1, has sheet resistance ranging from about 5 Ω/sq to 100 Ω/sq.

5. The hybrid transparent conducting electrode as claimed in claim 1, wherein the reduced graphene oxide film is a monolayer or comprises plurality of layers.

6. The hybrid transparent conducting electrode as claimed in claim 1, wherein the metal mesh comprises metal or alloy, wherein the metal is selected from a group comprising copper, silver, aluminium, gold, tin and nickel and the alloy is selected from a group comprising aluminium-zinc alloy, aluminium-silica alloy, copper-nickel alloy, bronze, nickel-chromium alloy, steel and mild steel.

7. The hybrid transparent conducting electrode as claimed in claim 1, has corrosion rate of about 0.0911 mm/year.

* * * * *